United States Patent

Hoshino

[11] Patent Number: 6,111,318
[45] Date of Patent: Aug. 29, 2000

[54] SEMICONDUCTOR DEVICE COMPRISING CU—TA AND METHOD FOR FORMING THE SEMICONDUCTOR DEVICE

[75] Inventor: Kazuhiro Hoshino, Kanagawa, Japan

[73] Assignee: Sony Corporation, Tokyo, Japan

[21] Appl. No.: 09/009,271

[22] Filed: Jan. 20, 1998

[30] Foreign Application Priority Data

Jan. 21, 1997  [JP]  Japan .................................. 9-008871

[51] Int. Cl.$^7$ .................................................. H01L 23/48
[52] U.S. Cl. .......................... 257/741; 257/748; 257/761; 438/685; 438/687
[58] Field of Search ..................................... 438/648, 685, 438/687, 660, 658; 257/741, 748, 761, 762, 763

[56] References Cited

U.S. PATENT DOCUMENTS 3,883,947  5/1975  Kruger et al. .

4,517,033  5/1985  Okumura et al. ........................ 148/432

FOREIGN PATENT DOCUMENTS 2-050432  2/1990  Japan .

*Primary Examiner*—Caridad Everhart
*Attorney, Agent, or Firm*—Hill & Simpson

[57] ABSTRACT

A wiring layer 17' of a semiconductor device is formed, at first, by forming a Cu—Ta film 15 by adding 0.5 weight % of Ta in Cu on a barrier metal layer, and then, by forming a cap metal layer on the film 15. The wiring layer 17' is then etched with a high temperature RIE method. After this, the wiring layer 17' is heat-treated at about 450 ° C. for about 120 minutes in a hydrogen reduction atmosphere. With this heat treatment, Ta is precipitated at the grain boundaries of Cu of the Cu—Ta layer 15. Since Ta does not tend to be alloyed with Cu easily and has low solid solubility in Cu crystal, Ta is precipitated at the grain boundaries of Cu by the above heat treatment. When Ta is precipitated at the grain boundaries of Cu such way, grain boundary diffusion is suppressed to generate less voids, so that the resistance to EM is improved.

8 Claims, 3 Drawing Sheets

SEMICONDUCTOR DEVICE COMPRISING CU— TA AND METHOD FOR FORMING THE SEMICONDUCTOR DEVICE

BACKGROUND OF THE INVENTION

The present invention relates to a semiconductor device and a method for forming those semiconductor devices, more particularly to a semiconductor device and a method for forming the semiconductor device using a conductor material having a low electric resistance and a high resistance to electromigration.

In the case of such a highly integrated semiconductor as a ULSI (Ultra Large Scale Integrated-circuit), the device operation speed, as well as the resistance to electromigration for wiring portions must be increased enough to obtain a high reliability in the long-term use.

As well known, the device operation speed can be increased by reducing the RC delay time of the wiring portions. In order to achieve the above object, therefore, it is required to reduce the electrostatic capacity (C) of the dielectric by using a film with low dielectric constant, as well as to reduce the electric resistance (R) of the wiring material. As the most common wiring material of such an LSI, an aluminum (Al) alloy is used because the alloy is easy to process. The Al alloy is used as Al-0.5%Cu (this means that 0.5% of copper is added in Al. And so forth.), Al-1%Si, etc. The specific resistance of the alloy is about 2.5 to 3.2 $\mu\Omega$cm.

On the other hand, as the wiring of such an LSI is thinned more and more owing to the improvement of the integration technology, the current density is also increased. As a result, the resistance to the elctromigration of the Al alloy (hereinafter referred to as "resistance to EM") becomes as a subject. The electromigration is a phenomenon that metallic ions of a wiring material are moved by colliding with the flow of electrons to grow voids in the wiring material, resulting in breaking of the wiring. Such a phenomenon is due to grain boundary diffusion in which the metallic ions of the wiring material are diffused mainly at crystal grain boundaries of the metal (hereinafter referred to simply as "grain boundaries"). Thus, the resistance to EM is dominated by the degree of the grain boundary diffusion.

Incidentally, Cu and Ag are used as wiring materials whose specific resistance is smaller than that of the Al alloy. The specific resistance of Cu is 1.8 $\mu\Omega$cm, so that it has an advantage to increase speed of the device operation. Compared with this, Ag is a metallic material having the lowest specific resistance, but it has a high reactivity to an oxide film and is considered to be difficult to be used as a wiring material of LSI. On the contrary, the reliability of the resistance to EM of the Cu wiring is 2 to 3 times higher than that of the Al alloy wiring. From these points of view, it is now being examined to use Cu as a ULSI wiring material.

As explained above, since the resistance to EM depends on the degree of grain boundary diffusion, a method is well-known to improve the resistance to EM in which impurities or a compounds of the wiring material are precipitated at grain boundaries to block the paths of mass transport and suppress generation of voids in the wiring material. This method is disclosed in Unexamined Published Japanese Patent Application No. 4-364739 (Application No. 3-139871). Although the resistance to EM of Cu is higher than that of Al, generation of electromigration must be further reduced to improve the long-term reliability of the device still more.

When impurities are added in Cu to suppress the generation of electromigration, however, the electric resistance is increased by the impurity scattering due to the added impurities while the resistance to EM is improved. This causes another problem that mere addition of impurities in Cu cannot keep the advantage of using the low resistance Cu in realizing a high speed operation of the device.

Under such the circumstances, it is an object of the present invention to provide a semiconductor device using a conductor material having a low electric resistance and a high resistance to EM and a method for forming such a semiconductor device.

SUMMARY OF THE INVENTION

In order to achieve the above object, the semiconductor device of the present invention comprises a conductor material comprising Cu—Ta for which tantalum (Ta) is added in copper (Cu) as a base. The method of the present invention for forming the semiconductor device comprises the steps of forming a Cu—Ta layer by adding tantalum (Ta) in copper (Cu) as a base; and precipitating Ta at grain boundaries of Cu by heat-treating the Cu—Ta layer.

In the Cu—Ta film formed by adding Ta in Cu as a base, Ta precipitates at grain boundaries of the Cu when the film is heat-treated. The Ta precipitated at the grain boundaries of the Cu then blocks the paths of mass transport of the Cu at the crystal grain boundaries to suppress grain boundary diffusion and accordingly suppress generation of voids in the layer. As a result, the resistance to EM of the Cu is improved. Furthermore, since Ta is not dissolved into Cu easily, impurity scattering in the Cu is suppressed, so that the electric resistance of the Cu is also suppressed low.

DESCRIPTION OF THE PREFERRED EMBODIMENTS

Figure 1A:
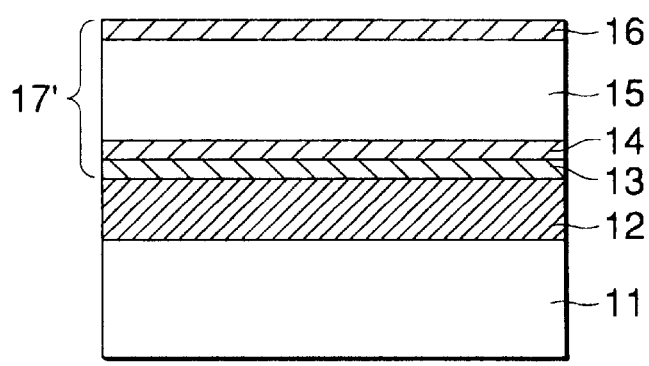
FIGS. 1A to 1C are cross sectional views explaining the semiconductor device and the method for forming the semiconductor device in the first embodiment of the present invention with FIG. 1A showing the SiO$_2$ film 12, the Ti film 13, the TiN film 14, the Cu—Ta film 15 and the TiN film 16 being laminated on the silicon substrate 11, FIG. 1B showing the inorganic mask 18 being formed on the wiring layer 17', and FIG. 1C showing the metallic wiring 17 being formed.
Figure 1B:
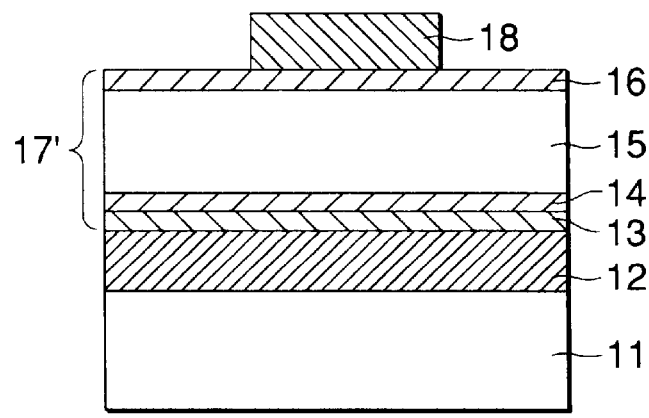
Figure 1C:
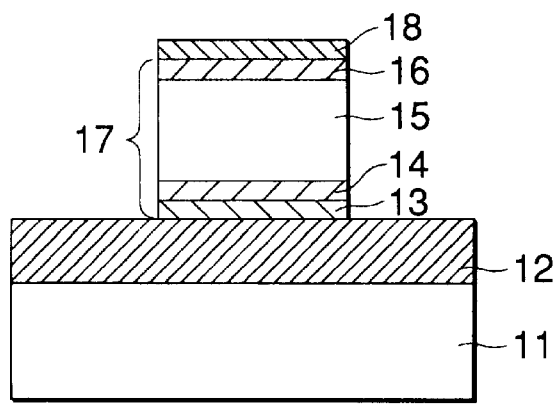

Hereunder, embodiments of the present invention will be explained with reference to the attached drawings. FIGS. 1A to 1C are cross sectional views explaining the wiring and processes for forming the semiconductor device in the first embodiment of the present invention. As prerequisites of forming the wiring of the semiconductor device, at first, transistors (not illustrated) including such components as an isolation region, an impurity diffused layer, and a gate electrode are formed on the silicon substrate 11 in ordinary LSI manufacturing processes. Then, a silicon dioxide (SiO$_2$)

film 12 for isolating each element is formed with a thickness of about 600 nm using a CVD (Chemical Vapor Deposition) method and contact holes (not illustrated) are formed at specified positions.

After this, as shown in FIG. 1A, a titanium (Ti) film 13 is formed on the $SiO_2$ film 12 with a thickness of about 30 nm using a spattering method. The conditions for forming the film 13 are as follows; Ti is used as the target and an argon (Ar) gas is flown at a rate of 40 SCCM. The pressure is 0.67 Pa and the temperature is 150° C. Then, a titanium nitride (TiN) film 14 is formed on the Ti film 13 with a thickness of about 70 nm using a spattering method. The conditions for forming the TiN film 14 are as follows; Ti is used as a target and a mixed gas of Ar and nitrogen ($N_2$) is flown at a rate of 30 SCCM for Ar and 100 SCCM for $N_2$. The pressure is 0.67 Pa and the temperature is 150° C. These Ti film 13 and TiN film 14 are used as barrier metal layers for metallic wiring.

Subsequently, on the barrier metal layers is formed a Cu—Ta film 15 with a thickness of about 500 nm by adding 0.5 weight % tantalum (Ta) into Cu that occupies the most part of the wiring layer using a spattering method. The conditions for forming the film 15 are as follows; Cu to which about 0.5 weight % of Ta is added is used as the target and an Ar gas is flown at a rate of 40 SCCM. The pressure is 0.67 Pa and the temperature is 300° C. Furthermore, on this film 15 is formed a TiN film 16 with a thickness of about 25 nm using a spattering method. The film 16 is used as a cap metal layer. The conditions for forming the film 16 are the same as those for the TiN film 14 used as the barrier metal layer. The Ti film 13, the TiN film 14, the Cu—Ta film 15, and the TiN film 16 formed above are all combined to form a wiring layer 17'.

After this, an $SiO_2$ film is deposited on the wiring layer 17' using an ordinary plasma CVD method and patterned to form an inorganic mask 18 consisting of an $SiO_2$ film at a thickness of about 200 nm as shown in FIG. 1B. Then, the entire wiring layer 17' is etched at once using a high temperature RIE (Reactive Ion Etching) method. The etching conditions are as follows; a parallel-plate RIE unit is used and a mixed gas of a silicon tetrachloride ($SiCl_4$) gas flown at a rate of 50 SCCM and an $N_2$ gas flown at a rate of 150 SCCM is used as the etching gas. The pressure is 13.3 Pa and the temperature is 300° C. With this, a metallic wiring 17 is formed in the shape as shown in FIG. 1C. Although an inorganic mask 18 is left with a thickness of about 50 nm on the cap metal layer consisting of the TiN film 16 after the etching, it is no need to remove the film in the subsequent processes.

After this, the film is heat-treated in a hydrogen reduction atmosphere. The temperature of the thermal treatment is about 450° C. and the treating time is about 120 minutes. With this heat treatment, Ta is precipitated at crystal grain boundaries of Cu in the Cu—Ta film 15. When this heat treatment is ended, an ordinary covering film is formed on the metallic wiring 17 shown in FIG. 1C or on the remained inorganic mask 18. Then, necessary pad holes are formed in the covering film.

The activating energy of Cu ion diffusion is about 1.4 eV for surface diffusion on the formed oxide film, about 1.2 eV for lattice diffusion, and about 0.6 eV for grain boundary diffusion when the wiring is formed with a simple substance of Cu. As is understood from this, the lowest activation, energy is found for the grain boundary diffusion. Thus, the Cu electromigration is mainly caused by grain boundary diffusion like in Al as explained above. In order to suppress such grain boundary diffusion, precipitation of impurities at grain boundaries is effective as explained above, but addition of impurities to Cu causes the impurities to be dissolved into the entire Cu at a certain density determined by the type and temperature. This causes the electric resistance of Cu to be increased owing to the impurity scattering.

Figure 2:
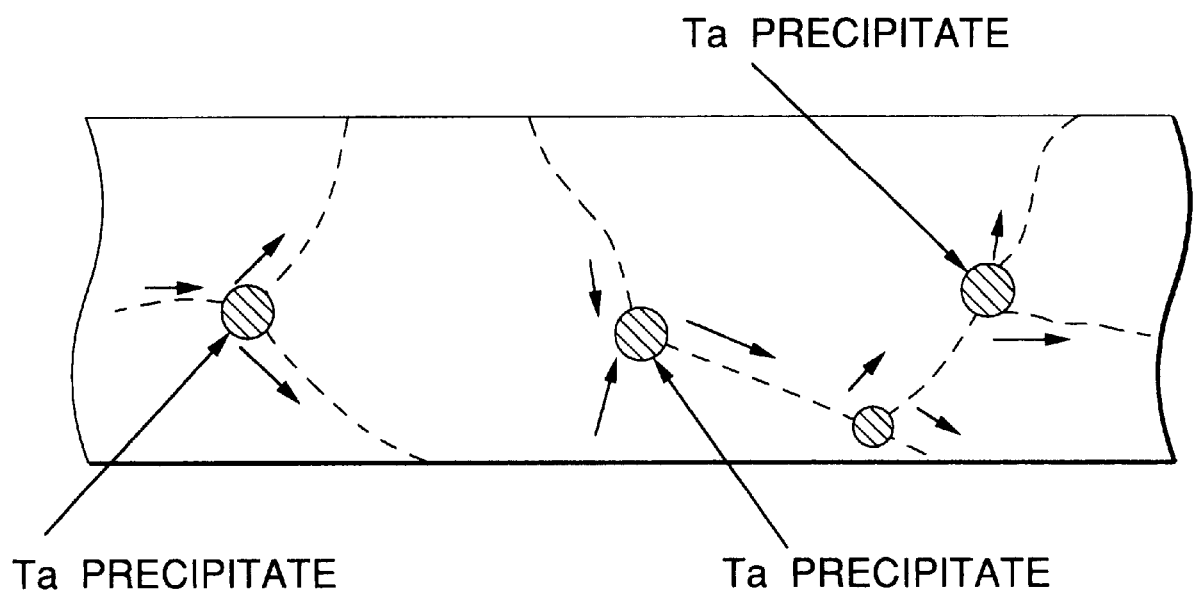
FIG. 2 is a schematic view of the Ta precipitation at Cu crystal grain boundaries.

The material Ta is not so easy to be alloyed with Cu that the Ta has low solid solubility into the Cu crystal. Thus, when the Cu—Ta film 15 is heat-treated with a slight addition of Ta at a temperature of about 450° C. for abut 120 minutes, the Ta is precipitated at grain boundaries of Cu without being dissolved into the crystal of Cu. FIG. 2 is a schematic view indicating such a phenomenon. In FIG. 2, the broken lines indicate grain boundaries and each region enclosed by the broken line indicates a crystal grain of Cu. And, each portion painted black indicates precipitated Ta. As shown in the figure, Ta is apt to deposit at grain boundaries where a plurality of crystal grains are in contact. When Ta is thus precipitated, the paths of mass transport of Cu at grain boundaries are blocked, so that grain boundary diffusion of Ta is suppressed. Thus, generation of voids in the layer is prevented and accordingly, the resistance to EM is improved. It is found experimentally that when Ta of 0.5 weight % or over is added to Cu, improvement effect of the resistance to EM begins to appear. As the fraction of the Ta is increased, the amount of deposited Ta is also increased to improve the resistance to EM more.

On the other hand, since the solid solubility of Ta into Cu is low, most of the Ta is precipitated at grain boundaries by a heat treatment as explained above even when a small amount of Ta is first added in Cu as shown in FIG. 1. Thus, little Ta is left in the crystal grains. Consequently, after the heat treatment, impurity scattering caused by Ta is suppressed and the electric resistance is brought to be low. As the amount of Ta to be added is increased gradually, however, the amount of Ta to be slightly dissolved into the crystal is also increased, so that the advantage of using low resistance Cu is lost. To avoid such a problem, therefore, the amount of Ta to be added into Cu should be limited within about 10 weight %. Taking those points into consideration, in the Cu—Ta film 15 in this embodiment, the contact of Ta added in Cu is determined to be 0.5 weight %.

Figure 3A:
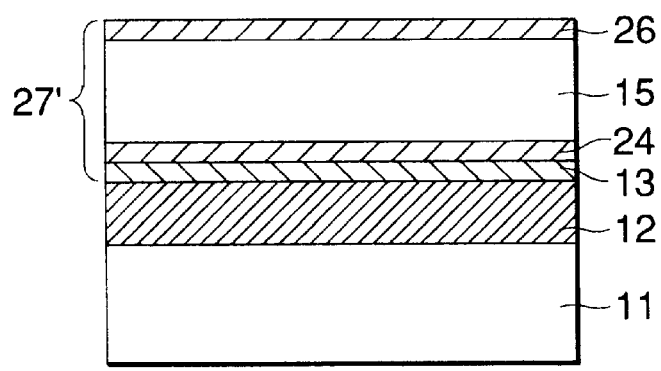
FIGS. 3A to 3C are cross sectional views explaining the semiconductor device and the method for forming the semiconductor device in the second embodiment of the present invention with FIG. 2A showing the SiO$_2$ film 12, the Ti film 13, the TaN film 24, the Cu—Ta film 15 and the TiON film 26 being laminated on the silicon substrate 11, FIG. 2B showing the inorganic mask 18 being formed on the wiring layer 27', and FIG. 2C showing the metallic wiring 27 being formed.
Figure 3B:
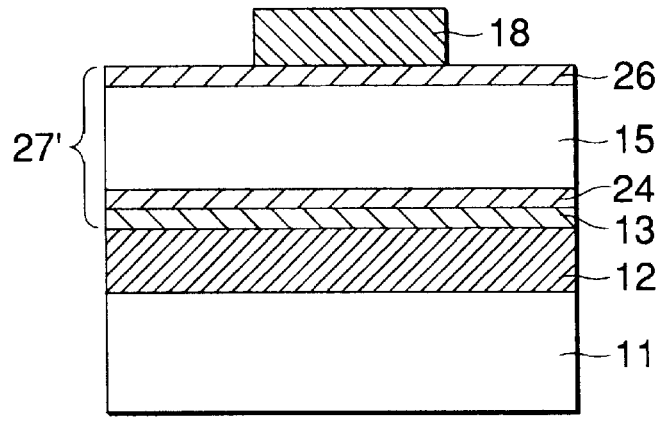
Figure 3C:
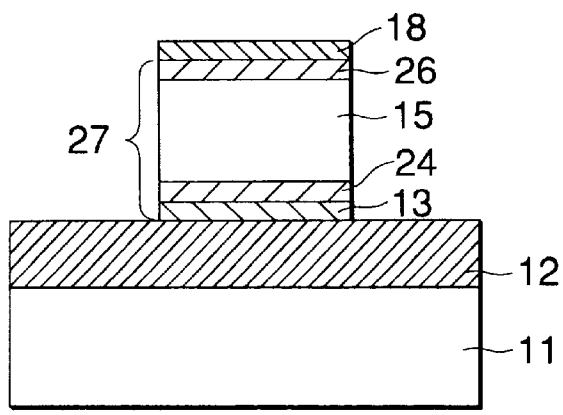

Hereunder, the second embodiment of the present invention will be explained with reference to FIGS. 3A to 3C. FIGS. 3A to C are cross sectional views explaining the semiconductor device and the method for forming the semiconductor device in the second embodiment of the present invention. In the figures, the same portions as those in the first embodiment shown in FIG. 1 are denoted by the same numerals, and redundant explanation for them is omitted. Hereunder, only different items from the first embodiment will be explained mainly.

In the first embodiment, the TiN film 14 is formed on the Ti film 13. In this embodiment, however, a tantalum nitride (TaN) film 24 is formed on the Ti film 13 with a thickness of about 70 nm using a spattering method as shown in FIG. 3A. The conditions for forming the film 24 are as follows; Ta is used as the target and a mixed gas of Ar and nitrogen ($N_2$) is flown at a rate of 30 SCCM for Ar and 100 SCCM for $N_2$. The pressure is 0.67 Pa and the temperature is 150° C. In this embodiment, the two layers of Ti film 13 and TaN film 24 are used as barrier metal layers for metallic wiring.

Furthermore, although a TiN film 16 used as a cap metal layer is formed on the Cu—Ta film 15 in the first embodiment, a titanium oxide nitride (TiON) layer 26 is formed on the Cu—Ta film 15 with a thickness of about 25 nm and used as a cap metal layer in this embodiment. The conditions for forming the film 26 are as follows; Ti is used as the target and a mixed gas of Ar, $N_2$, and $O_2$ is flown at a rate of 30 SCCM for Ar, 100 SCCM for $N_2$, and 5 SCCM for $O_2$. The pressure is 0.67 Pa and the temperature is 150° C. In this embodiment, the Ti film 13, the TaN film 24, the Cu—Ta film 15, and the TiON film 26 are all combined to form a wiring layer 27'.

The subsequent processes are the same as those of the first embodiment. As shown in FIG. 3B, a 200 nm thick inorganic mask 18 consisting of $SiO_2$ is formed on the wiring layer 27', then the entire wiring layer 27' is etched with a high temperature RIE method to form a metallic wiring 27 in the form as shown in FIG. 3C. Then, the wiring 27 is heat-treated in a hydrogen reduction atmosphere to precipitate Ta at crystal grain boundaries of the Cu of the Cu—Ta film 15. When the heat treatment ends, an ordinary covering film is formed on the metallic wiring 27 shown in FIG. 3C or the remaining inorganic mask 18 and necessary pad holes are formed in the covering film.

Like in the first embodiment, a small amount of Ta is also added in the Cu—Ta film 15 in this embodiment. Thus, the paths of mass transport of Cu at grain boundaries are blocked by Ta precipitated at crystal grain boundaries of Cu by the heat treatment, so that generation of voids in the Cu—Ta film 15 is suppressed significantly. This is why the resistance to EM is improved. In addition, since only a slight amount of Ta is also added in Cu, impurity scattering caused by Ta is suppressed and the low electric resistance of Cu is kept.

The present invention is not limited only to the above embodiments, but it can be modified freely within the spirit and scope of the invention. For example, the Cu—Ta film 15 formed with a spattering method, which is one of PVD (Physical Vapor Deposition) methods, in the above embodiments can also be formed with another PVD or CVD method. In addition, although the Cu—Ta film 15 is formed by adding Ta in Cu by 0.5 weight % in the above embodiments, the fraction of Ta can be changed freely if it is within a range that can suppress the grain boundary diffusion in Cu and the low electric resistance of Cu can be kept. Furthermore, although the Cu—Ta film 15 is used mainly for a wiring to electrically connect elements to each other, this invention is not limited only to this purpose. For example, the Cu—Ta film can also be used for electrically interconnection of multi-layers.

In addition, the Ti layer 13 and the TiN layer 14 are used as barrier metal layers in the first embodiment and the Ti layer 13 and the TaN layer 24 are used as barrier metal layers in the second embodiment. However, instead of those materials, other materials selected from metals such as zirconium (Zr), tangsten (W), molybdenum (Mo), hafnium (Hf), magnesium (Mg), as well as nitride, carbide, and nitride oxide of those metals can be used as barrier layers. In the same way, although TiN is used as a cap metal layer in the first embodiment and TiON is used as a cap metal layer in the second embodiment, other materials selected from metals such as zirconium (Zr), tangsten (W), molybdenum (Mo), hafnium (Hf), magnesium (Mg), as well as nitride, carbide, and nitride oxide of those metals, or carbon (C), silicon (Si), silicon oxide nitride (SiON), and silicon carbide (SiC) can be used as barrier layers.

As explained above, according to the present invention, since Cu—Ta obtained by adding tantalum (Ta) in copper (Cu) is used as a conductor material, a heat treatment of the Cu—Ta precipitates Ta at crystal grain boundaries of Cu. As a result, grain boundary diffusion in Cu is suppressed and the resistance to electromigration is improved. Thus, the long-term reliability of the object semiconductor device can be improved significantly. In addition, since the solid solubility of Ta in Cu is low, the intrinsic low electric resistivity of Cu can be kept enough even when a small amount of Ta is added in Cu. Consequently, the RC delay time of wired portions can be reduced, so that the operation speed of the semiconductor device can be made faster.

What is claimed is:

1. A semiconductor device comprising a conductor material comprising Cu—Ta for which tantalum (Ta) is added in copper (Cu) as a base; and wherein said Cu—Ta has said tantalum (Ta) precipitated at grain boundaries of said copper (Cu).

2. By A semiconductor device as defined in claim 1, wherein said Cu—Ta has within 0.05 to 10 weight % of tantalum (Ta) added in said copper (Cu).

3. A semiconductor device as defined in claim 1, wherein said conductor material is used to wiring between elements or electrical interconnection between multi-layer wirings.

4. A semiconductor device comprising a conductor material comprising Cu—Ta for which tantalum (Ta) is added in copper (Cu) as a base; and wherein under a conductor layer formed with said Cu—Ta is formed a barrier layer comprising at least one material selected from the material group consisting of titanium (Ti) tantalum (Ta) zirconium (Zr), tungsten (W), molybdenum (Mo), hafnium (Hf) and Magnesium (Mg), and nitride, carbide and nitride oxide including at least one of those materials.

5. A semiconductor device comprising a conductor material comprising Cu—Ta for which tantalum (Ta) is added in copper (Cu) as a base; and wherein on a conductor layer formed with said cu—Ta is formed a cap layer comprising at least one material selected from a material group consisting of titanium (Ti), tantalum (Ta), zirconium (Zr), tungsten (W), molybdenum (Mo), hafnium (Hf) and magnesium (Mg), nitride, carbide and nitride oxide including at least one of those materials, and carbon (C), silicon (Si), silicon nitride oxide (SiON) and silicon carbide (SiC).

6. A method for forming a semiconductor device comprising the steps of:

forming a Cu—Ta layer by adding tantalum (Ta) in copper (Cu) as a base; and precipitating Ta at the grain boundaries of Cu by heat-treating said Cu—Ta layer.

7. A method for forming said semiconductor device as defined in claim 6, wherein said Cu—Ta layer is formed with one of a physical vapor deposition (PVD) method and a chemical vapor deposition (CVD) method.

8. A method for forming said semiconductor device comprising the steps of:

forming a barrier layer on an insulator;

forming a Cu—Ta layer on said barrier layer by adding tantalum (Ta) in copper (Cu);

forming a cap layer on said Cu—Ta layer;

pattering said barrier layer, said Cu—Ta layer, and said cap layer; and heat-treating said Cu—Ta layer.

* * * * *